US005097156A

United States Patent [19]

Shimabukuro et al.

[11] Patent Number: 5,097,156

[45] Date of Patent: Mar. 17, 1992

[54] CIRCUITRY FOR COMPENSATING FOR TRANSISTOR PARAMETER MISMATCHES IN A CMOS ANALOG FOUR-QUADRANT MULTIPLIER

[75] Inventors: Randy L. Shimabukuro, San Diego; Patrick A. Shoemaker, Lemon Grove, both of Calif.

[73] Assignee: The United States of America as represented by the Secretary of the Navy, Washington, D.C.

[21] Appl. No.: 685,590

[22] Filed: Apr. 11, 1991

[51] Int. Cl.[5] .......................... G06G 7/12; H03L 7/00

[52] U.S. Cl. .................................... 307/491; 307/512; 328/166

[58] Field of Search ........................ 307/498, 491, 512; 328/160, 166; 364/841

[56] References Cited

U.S. PATENT DOCUMENTS 3,668,440 6/1972 Davis et al. ......................... 328/160
3,805,092 4/1974 Henson ............................... 328/160
4,144,581 3/1979 Prudente .............................. 328/18
4,375,013 2/1983 Cointot et al. ....................... 341/143
4,572,975 2/1986 Bowers .............................. 328/160
4,906,873 3/1990 Shoemaker et al. ................ 328/160
4,978,873 12/1990 Shoemaker ......................... 328/160

OTHER PUBLICATIONS

Highleyman et al., "An Analog Multiplier Using Two FETs", IRE Transactions on Comm. Systems, pp. 311-317, Sep., 1962.

*Primary Examiner*—Stanley D. Miller
*Assistant Examiner*—Toan Tran
*Attorney, Agent, or Firm*—Harvey Fendelman; Thomas Glenn Keough; Michael A. Kagan

[57] ABSTRACT

The present invention provides a circuit for eliminating quadratic and offset errors in the output of a CMOS four-quadrant analog multiplier. These errors are eliminated by feedback circuits that each include one or more CMOS four-quadrant analog multipliers.

24 Claims, 4 Drawing Sheets

CIRCUITRY FOR COMPENSATING FOR TRANSISTOR PARAMETER MISMATCHES IN A CMOS ANALOG FOUR-QUADRANT MULTIPLIER

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates to the field of multiplier circuits, and more particularly, to the field of four-quadrant analog multiplier circuits.

Analog multiplier circuits form important building blocks for devices such as adaptive filters, function generators, and modulators. In the emerging field of artificial neural networks, implementation of useful network structures in analog integrated circuitry will in many cases require large arrays of multipliers.

One type of multiplier is described in U.S. Pat. No. 4,978,873, by Shoemaker, entitled "CMOS Analog Four-Quadrant Multiplier." This multiplier provides four-quadrant multiplication of two values represented by input voltages, $V_1$ and $V_2$, which are applied to the transistors. The output of the circuit is proportional to the product $(V_1V_2)$.

One embodiment of this type of multiplier includes a complementary pair of n- and p-channel transistors. The respective threshold voltages $V_{tn}$ and $V_{tp}$ of the n- and p-channel transistors satisfy the relation: $V_{tp}-V_{tn}>0$. The gates of the two transistors are connected in common and receive a voltage which is the sum of input $V_1$ and a bias voltage $V_b$, where $V_b=(V_{tp}+V_{tn})/2$. The bias voltage, $V_b$, eliminates offset in the circuit output due to threshold voltage magnitude mismatch. Second voltage input $V_2$ and its inverse $-V_2$ are also provided to the circuit. In the case where $V_2>0$, $V_2$ is provided to the terminal of the n-channel transistor which acts as the drain and $-V_2$ is provided to the terminal of the p-channel transistor which acts as the drain. The terminals of each transistor which act as sources are connected at an output node. In the case where $V_2<0$, then $V_2$ and $-V_2$ are applied to the same physical terminals as in the first case, however, these two terminals become the sources of the two transistors due to the difference in polarity of the applied voltages from those of the first case. In the latter case, the two terminals which are connected at the output node become the drains of the two transistors. In either case, the circuit provides an output proportional to the product $(V_1V_2)$.

A second embodiment of the multiplier described in U.S. Pat. No. 4,978,873 includes two pairs of complementary MOS transistors, where each pair is configured similarly to the circuit of the first embodiment, except that the inputs $V_1$, $V_2$, and $-V_2$ are replaced by their inverses $-V_1$, $-V_2$, and $V_2$, respectively, on one of the two pairs. The output nodes of the individual transistor pairs are connected in common. The bias voltage used in this circuit may deviate significantly from that of the first embodiment as the error which such a deviation would cause in the first embodiment is canceled in the second. However, a disadvantage of this embodiment is that it requires two pairs of transistors and the inverse $-V_1$ of the voltage $V_1$.

A limitation of the above-referenced four-quadrant multiplier is that it requires matching of the transconductance constants of the n- and p-channel MOSFET's. If transistors without such matching are used in the circuit, nonlinearities and additional offsets are introduced, resulting in distortion in the circuit output. Such mismatches can result from the manufacturing processes by which the transistors are fabricated, or from temperature, radiation, or aging effects.

Therefore, there is a need for a circuit that compensates for mismatches in both transistor threshold voltage magnitudes and transconductance constants.

SUMMARY OF THE INVENTION

The present invention provides circuitry which may be used in combination with a CMOS four-quadrant analog multiplier of the type described in U.S. Pat. No. 4,906,873 to compensate for imperfect device matching, and will also compensate for temperature drift, radiation, and aging effects. The invention improves the accuracy of the outputs of such multipliers by also compensating for aging and environmental effects.

The present invention provides a circuit for eliminating quadratic and offset errors in the output of a CMOS four-quadrant analog multiplier. These errors are eliminated by feedback circuits that each include one or more CMOS four-quadrant analog multipliers.

Three embodiments of the invention are presented herein. The first preferred embodiment eliminates quadratic errors and includes: first and second CMOS four-quadrant analog multipliers each having an n-channel field effect transistor having a gate, first and second terminals, a channel forming a source-drain path between the first and second terminals, and a p-channel field effect transistor having a gate, first and second terminals, and a channel forming a source-drain path between the first and second terminals. For each multiplier, the second terminal of the n-channel transistor is operatively coupled to the first terminal of the p-channel transistor so as to form a first output node. The first embodiment further includes: a first unity gain inverting buffer having an input connected to the first terminal of the n-channel transistor of the first CMOS four-quadrant multiplier and an output connected to the first terminal of the n-channel transistor of the second CMOS four-quadrant multiplier; a second unity gain inverting buffer having an input connected to the second terminal of the p-channel transistor of the first CMOS fourquadrant multiplier and an output connected to the second terminal of the p-channel of the second CMOS four-quadrant multiplier; a high gain differential amplifier having an input connected to the first and second output nodes, a second input connected to ground, and an output for providing a gain control voltage $V_G$; an inverting voltage controlled amplifier having an input connected to the first terminal of the n-channel transistor of the first multiplier, a variable voltage gain λ, an output connected to the second terminal of the p-channel transistor of the first CMOS four-quadrant multiplier, and a gain control input connected to receive the voltage, $V_G$, from the high gain differential amplifier. A voltage source provides a voltage $V_{b1}$ to the gates of the n- and p-channel transistors of the first and second multipliers; a second voltage source connected to provide a voltage $V_{b2}$ to the first terminal of the n-channel transistor and to the input of the inverting voltage controlled amplifier, whereby the output of the inverting voltage controlled amplifier provides a voltage $-\lambda V_{b2}$ to the second terminal of the p-channel transistor of the first multiplier, and the output of the first unity inverting buffer provides a voltage $-V_{b2}$ to the first terminal of the n-channel transistor of the second multiplier. The output of the second unity inverting buffer provides a voltage $-\lambda V_{b2}$ to the second terminal of the p-channel transistor of the second multiplier.

The second embodiment provides a circuit which eliminates offset error and includes: a CMOS four-quadrant multiplier which includes an n-channel field effect transistor having a gate, first and second terminals, and a channel forming a source-drain path between the first and second terminals; and a p-channel field effect transistor having a gate, first and second terminals, and a channel forming a source-drain path between the first and second terminals. The second terminal of the n-channel transistor is connected to the first terminal of the p-channel transistor so as to form an output node. The second embodiment further includes a high gain differential amplifier having a first input operably coupled to the output node, a second input operably coupled to ground, and an output operably coupled to provide a voltage $V_B$ to the gates of the n- and p-channel transistors. A voltage source provides a voltage $V_{b2}$ to the first terminal of the n-channel transistor. Another voltage source provides a voltage $-\lambda V_{b2}$ to the second terminal of the p-channel transistor.

The third embodiment compensates for both quadratic and offset errors, and includes a quadratic error compensation circuit connected to the offset error compensating circuit.

Circuits embodying four-quadrant analog multipliers may be more readily fabricated since there does not need to be exact transistor parameter matching. Application of the invention should, therefore, increase production yields, reduce the costs of multiplier circuits, provide more accurate outputs in comparison to existing multipliers. These and other advantages will become more readily apparent in light of the appended teachings.

DESCRIPTION OF THE PREFERRED EMBODIMENT

Figure 1:
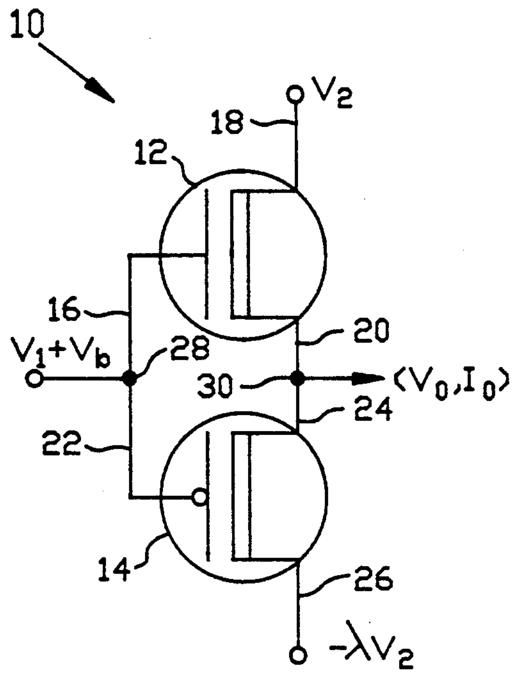
FIG. 1 is a schematic of a four-quadrant multiplier circuit.

FIG. 1 is a schematic of multiplier circuit 10 of the type described in U.S. Pat. No. 4,906,873, incorporated herein by reference. In the present invention, $V_2$ is applied to terminal 18 of n-channel transistor 12 and $(V_1+V_b)$ is applied at gates 16 and 22. However, $-\lambda V_2$ is applied to terminal 26 of p-channel transistor 14, rather than $-V_2$ as shown in FIG. 1 of U.S. Pat. No. 4,906,873.

The general expression for the operation of multiplier circuit is derived from Eqn. 1 below, the first order approximation for drain current through a MOSFET operating in the triode region:

$$I_d=\beta\{(V_{gs}-V_t)V_{ds}-\tfrac{1}{2}V^2_{ds}\} \tag{1}$$

where:

- $\beta$ is the transconductance constant;
- $I_d$ is the drain current (taken as positive into the drain);
- $V_{gs}$ is the gate-to-source voltage;
- $V_{ds}$ is the drain-to-source voltage;
- $V_t$ is the threshold voltage.

Hereafter, the subscripts "n" and "p" refer to the n- and p-channel transistors, respectively. For an n-channel transistor, we substitute $\beta_n=\mu_n(C_{ox})_n(W/L)_n$ for $\beta$; for a p-channel transistor, we substitute $-\beta_p=-\mu_p(C_{ox})_p(W/L)_p$ for $\beta$, where:

- $\mu$ is the channel mobility;
- $C_{ox}$ is the capacitance per unit area across the gate oxide of the transistor; and
- W and L are the width and length, respectively, of the channel of the transistor.

Figure 2:
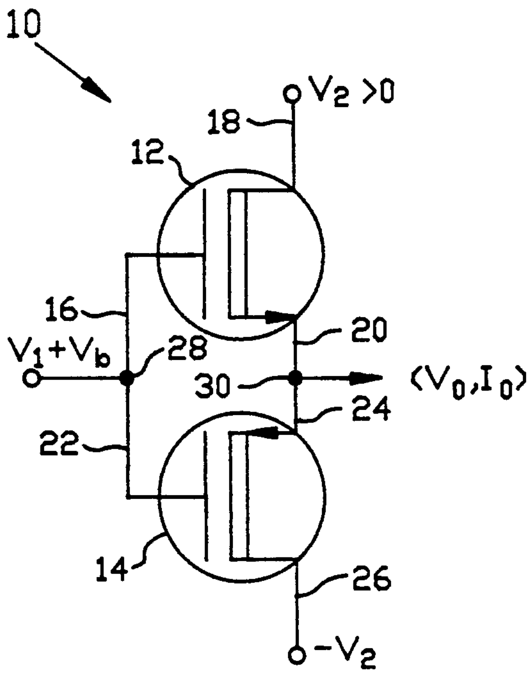
FIG. 2 is a schematic of a four-quadrant multiplier circuit, where $V_2>0$.

Operation of multiplier circuit 10 for the case in which $V_2>0$ is illustrated in FIG. 2. Substitution of the voltages $V_1$, $V_2$, and $-\lambda V_2$, and of the appropriate $\beta$ and $V_t$ values into Eqn. 1 yields the following expressions for the drain currents $I_{dn}$ and $I_{dp}$ of n and p channel transistors 12 and 14, respectively:

$$I_{dn}=\kappa\{(V_1+V_b-V_o+V_T)(V_2-V_0)-\tfrac{1}{2}(V_2-V_0)^2\}$$

$$I_{dp}=-\xi\kappa\{(V_1+V_b-V_0-\psi V_T)(-V_2-\lambda V_0)-\tfrac{1}{2}(--V_2-V\ )^2\} \tag{2}$$

where $V_0$ is the output voltage and with the following substitutions $V_T=-V_{tn}$, $\psi=-V_{tp}/V_{tn}$, $\kappa=\beta_n$ and $\xi=\beta_p/\beta_n$.

Figure 3:
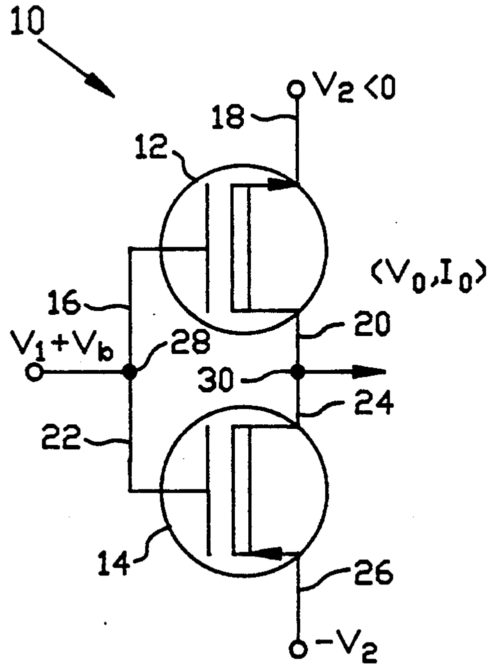
FIG. 3 is a schematic of a four-quadrant multiplier circuit, where $V_2<0$.

The case where $V_2<0$ is shown in FIG. 3. Making the substitutions shown immediately above yields:

$$I_{dn}=\kappa\{(V_1+V_b-V_2+V_T)V_0-V_2)-\tfrac{1}{2}(V_0-V_2)^2\}$$

$$I_{dp}=-\xi\kappa\{(V_1+V_b+\lambda V_2-\psi V_T)(V_0+\lambda V_2)-\tfrac{1}{2}(V_0+\lambda V_2)^2\} \tag{3}$$

The output current is expressed as:

$$I_0=I_{dn}+I_{dp}\quad V_2>0 \tag{4}$$

$$I_0=-(I_{dn}+I_{dp})\quad V_2<0$$

Substitution of the expressions for $I_{dn}$ and $I_{dp}$ of Eqns. 2 or 3 into 4 and solving for $I_0$ yields:

$$I_0=\kappa\{(1-\xi)V^2_0/2+((\xi-1)(V_1+V_b)-(1+\psi\xi)V_TV_0+(1+\lambda\xi)(V_1+V_b)V_2+(1-\xi\lambda\psi)V_TV_2+(-\lambda^2\xi-1)V^2_2/2\} \tag{5}$$

for $V_2>0$ or $V_2<0$.

In the ideal case the thresholds and transconductances are matched, and so we have $\xi=1$ and $\psi=1$. If we then set $\lambda=1$, and $V_b=0$, Eqn. 5 reduces to:

$$I_0=2\kappa(V_1V_2-V_TV_0) \quad (6)$$

In the short circuit mode ($V_0=0$):

$$I_0=2\kappa V_1V_2 \quad (7)$$

For the open circuit ($I_0=0$) we get:

$$V_0=V_1V_2/V_T \quad (8)$$

In a non-idealized circuit, the operating characteristics of the MOSFET's will not be exactly matched. Therefore, the parameters $\xi$ will $\psi$ not be exactly equal to one. The short circuit current $I_0$ can be found in this more general case by setting $V_0=0$ in Eqn. 5 which gives:

$$I_0=\kappa\{(1+\lambda\xi)V_1V_2+\{(1-\xi\lambda\psi)V_T+(1+\lambda\xi)V_b\}V_2+(\lambda^2\xi-1)V_2^2/2\} \quad (9)$$

The first term gives us the desired product of $V_1$ and $V_2$. The second term corresponds to an offset in the value of $V_1$, giving $(V_1+\xi)V_2$ rather than the desired product. The third term is a quadratic error term in $V_2$. The offset can be eliminated by setting $V_b=-(1-\xi\lambda\psi)V_T/(1+\lambda\xi)$ and the quadratic error term can be eliminated by setting $\lambda=\xi^{-\frac{1}{2}}$. Making these substitutions, Equation (9) becomes:

$$I_0=\kappa(1+\xi^{\frac{1}{2}})V_1V_2 \quad (10)$$

This invention provides a feedback circuit which computes bias voltage $V_b$, which is to be added to input voltage $V_1$. When input $V_2$ is applied to the circuit from an external source, the voltage $-\lambda V_2$ may be computed with an inverting buffer with a gain of magnitude $\lambda=\xi^{-\frac{1}{2}}$. The invention also includes a second feedback circuit which adjusts the gain of a voltage controlled inverting buffer to magnitude $\lambda$.

Figure 4A:
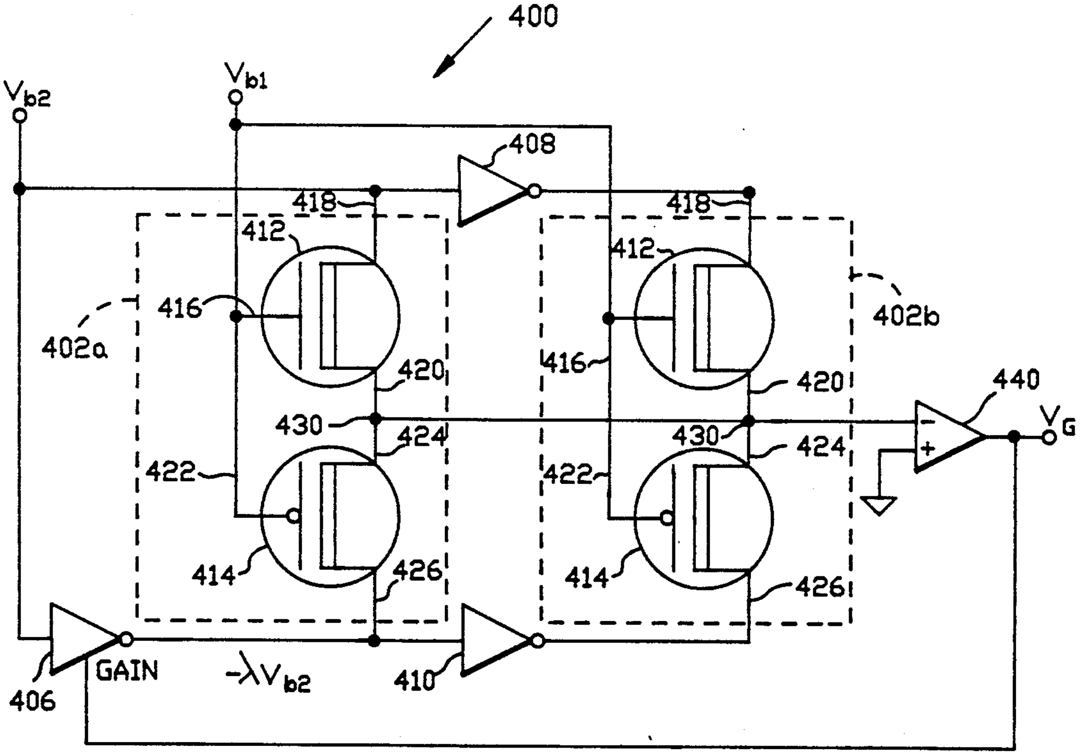
FIG. 4A is a schematic of one quadratic error compensation circuit for transconductance constant mismatch for a four-quadrant analog multiplier of the type presented in FIG.'s 1-3, above.

This second feedback circuit, circuit 400, is described with reference to FIG. 4A. Feedback circuit 400 includes multipliers 402*a* and 402*b* which are multiplier circuits 10 of the type described in U.S. Pat. No. 4,906,873, incorporated herein by reference. Bias voltage $V_{b1}$ is applied to transistor gates 416 and 422 of transistors 412 and 414, respectively, which comprise multiplier 402*a*; and to transistor gates 416 and 422 of transistors 412 and 414, respectively, which comprise multiplier 402*b*. Voltage $V_{b2}$ is provided to terminal 418 of multiplier 402*a* and to the input of amplifier 406. Amplifier 406 is a voltage-controlled amplifier having a voltage gain which is variable about −1 and which has a magnitude that is a monotonic increasing function of the control voltage $V_G$. The output of amplifier 406, $-\lambda V_2$, is provided to terminal 426 of multiplier 402*a*. Unity-gain inverting buffer 408 receives input $V_{b2}$, and supplies its output to terminal 418 of multiplier 402*b*. Unity-gain inverting buffer 410 receives input $-\lambda V_2$ and provides its output to terminal 426 of multiplier 402*b*. The negative input of amplifier 440 is connected to output nodes 430 of multipliers 402*a* and 402*b*. The positive input of amplifier 440 is connected to ground. Amplifier 440 is a high-gain differential amplifier which produces the gain control signal $V_G$ that is provided to the gain control input of amplifier 406.

$V_{b1}$ lies within the permissible range for the $V_1$ input to the multipliers, and $V_{b2}$ is a bias voltage which is some substantial fraction of the full-scale $V_2$ input permissible for multipliers 10. [See U.S. Pat. No. 4,978,873 at column 4, line 64 to column 5, line 16.]

Circuit 400 operates as follows: Amplifier 440 adjusts he gain of amplifier 406 via feedback so that the negative input terminal of amplifier 440 is brought very near ground. Thus, if amplifier 440 is specified to draw negligible current at its inputs, the output condition for the coupled multipliers 402*a* and 402*b* is zero current into ground (zero voltage). The configuration of multipliers 402*a* and 402*b* is such that both the product and offset terms in their output currents tend to cancel; the only remaining term is the quadratic error term. Therefore, by adjusting the gain of amplifier 406 so that this term is zero as well, that gain is set very nearly to $\xi^{-\frac{1}{2}}$ in magnitude. The gain control signal $V_G$ could then be used to control the gains of inverting voltage- controlled amplifiers similar to amplifier 406 which may be used in conjunction with other multiplier circuits on the same chip.

Figure 4B:
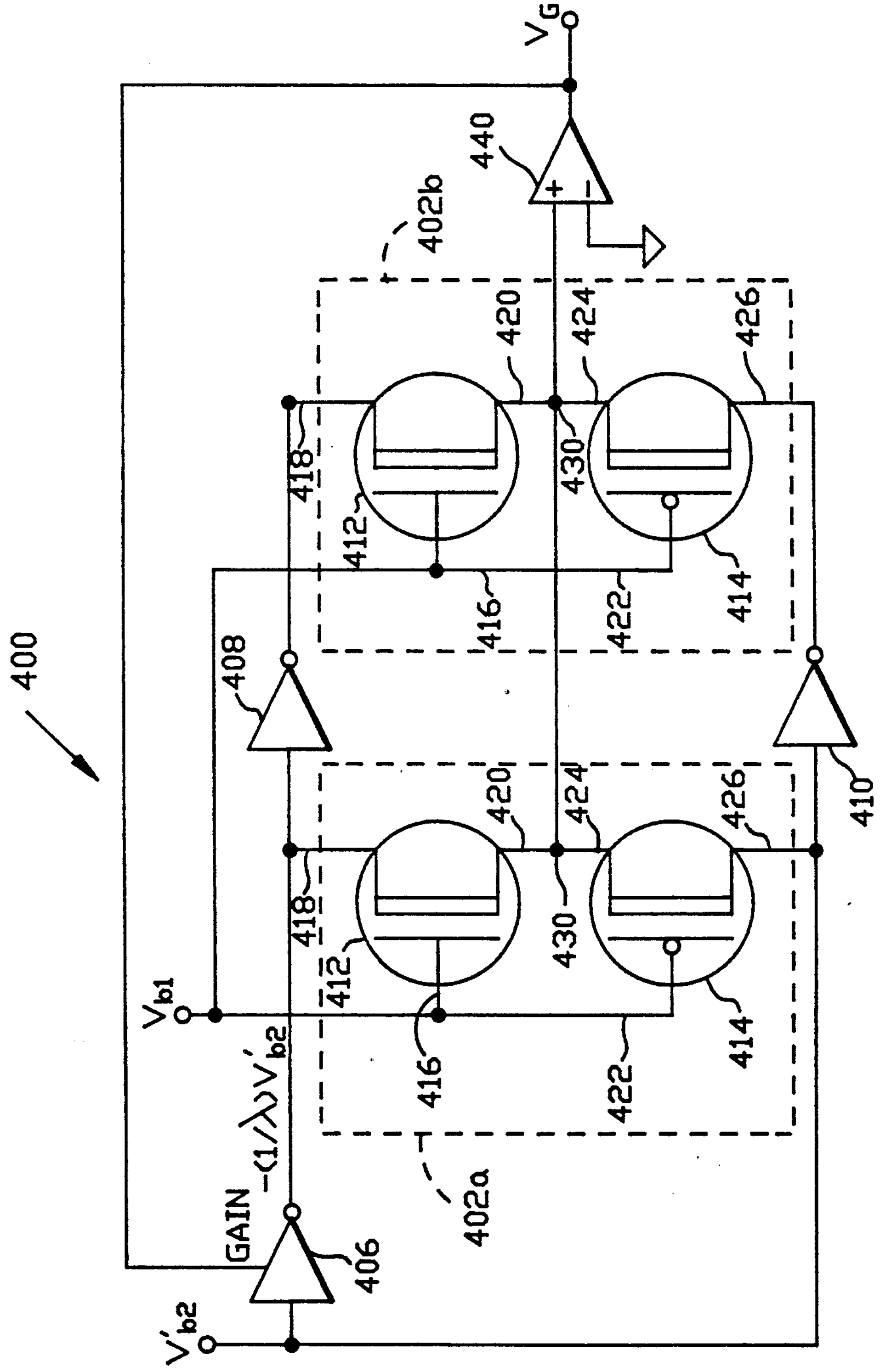
FIG. 4B is a schematic of a second quadratic error compensation circuit for transconductance constant mismatch for a four-quadrant analog multiplier of the type presented in FIG.'s 1-3, above.

It is to be understood that the invention comprehends other obvious variations on this principle. For example, referring to FIG. 4B, a bias voltage $V_{b2}'$ could be applied directly to p-channel transistor 414 in multiplier 402*a* and to the input of inverting buffer 410, and a variable-gain amplifier such as amplifier 406 could be used to invert $V_{b2}'$, which yields $-(1/\lambda)V_{b2}'$, for application to n-channel transistor 412 in multiplier 402*a* and to the input of inverting buffer 408. This gain could be controlled by feedback so as to eliminate the quadratic output current of multipliers 402*a* and 402*b*, in a scheme analogous to that described in the previous paragraph.

Figure 5:
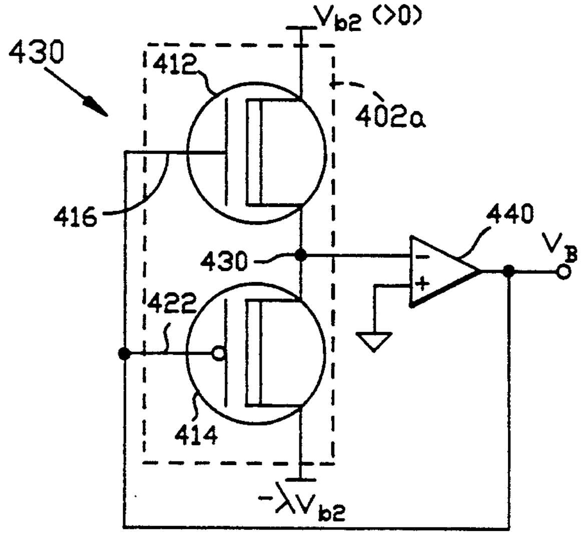
FIG. 5 is a schematic of an offset compensation circuit for a four-quadrant analog multiplier of the type presented in FIG.'s 1-3, above.

FIG. 5 depicts offset compensation circuit 430 designed to eliminate offset errors by establishing an appropriate bias voltage. Here as with circuit 400, shown in FIG. 4A, $V_{b2}$ is a non-zero bias voltage which is less than or equal in magnitude to the full-scale $V_2$ input permissible for multiplier 402*a*. In this case $V_{b2}$ is assumed positive. The factor $\lambda$, used to compute the input voltage applied to p-channel transistor 414 of multiplier 402*a*, is determined so as to eliminate the quadratic error term in the output of multiplier 402*a*. The output node 430 of multiplier 402*a* is connected to the negative input of amplifier 440. Amplifier 440 is a high-gain differential amplifier which produces the offset-compensating bias voltage $V_B$. The circuit operates as follows: Amplifier 440 adjusts the gate bias provided to transistors 412 and 414 of multiplier 402*a* via feedback ($V_B$) so that the negative input terminal of amplifier 440 is brought very near ground. Thus, if amplifier 440 is specified to draw negligible current at its inputs, the output condition for the multiplier 402*a* is zero current into ground (zero voltage), and $V_B$ is the bias which needs be added to a $V_1$ input to eliminate offset error. If $V_{b2}<0$, then the same bias could be computed by interchanging the inputs to differential amplifier 440. The bias computed by amplifier 440 could be summed with $V_1$ inputs to other multipliers on a chip, or it could be capacitively coupled to floating gates used in conjunction with multipliers.

Figure 6:
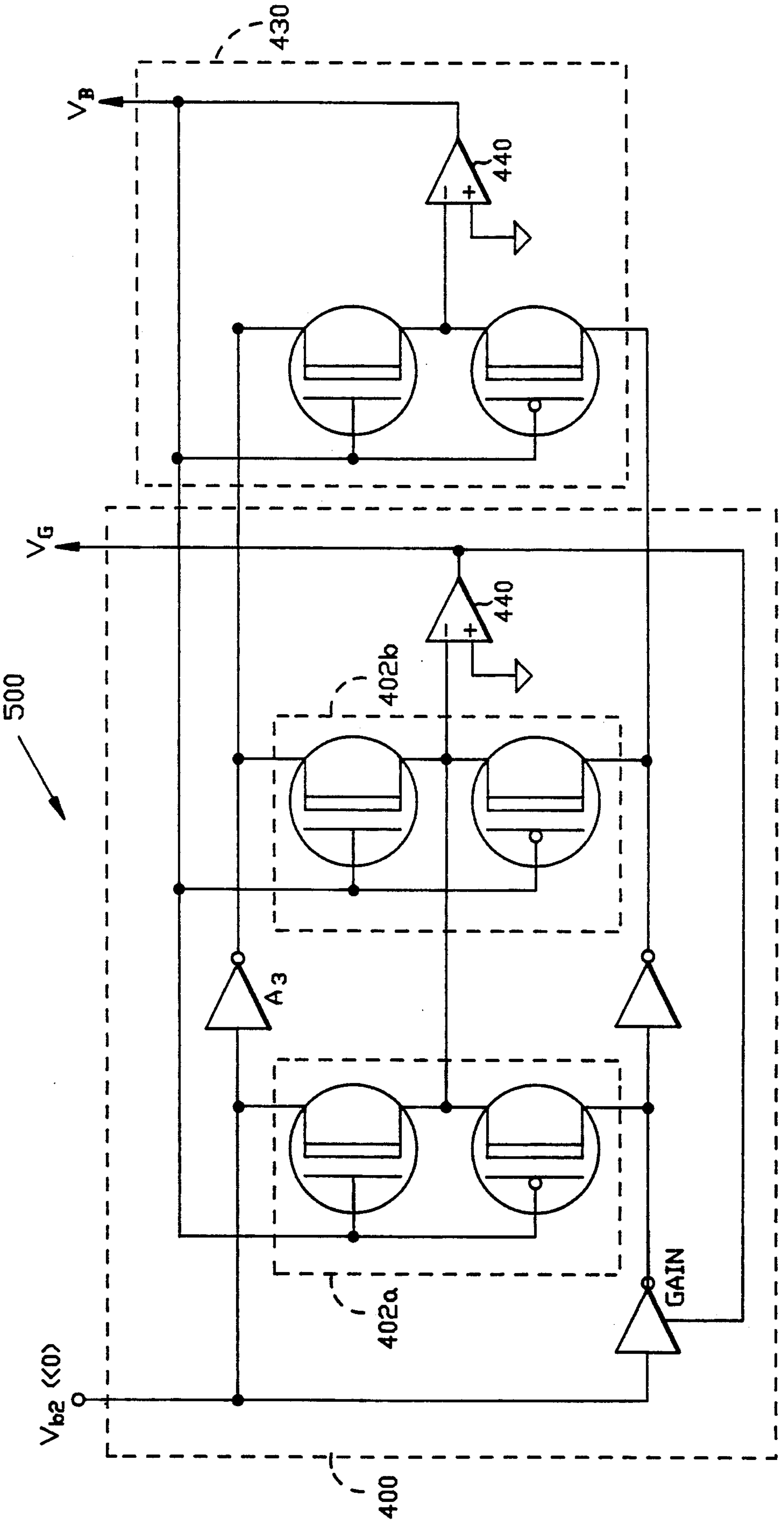
FIG. 6 is a schematic of a compensation circuit for both transconductance constant mismatch and offset for a four-quadrant analog multiplier of the type presented in FIG.'s 1-3, above.

FIG. 6 depicts compensation circuit 500 which combines compensation circuits 400 and 430, previously described with reference to FIGS. 5 and 6, to compute both $V_G$ and $V_B$. Circuits 400 and 430 are combined such that the output $V_B$ of amplifier 440 of compensation circuit 430 is provided to the gates of the transistors of multipliers 402*a* and 402*b*.

The gain $\lambda$, computed by compensation circuit 500, can also be utilized to remove the $V_2^2$ term in multipliers operated with open circuit output, although other error terms may remain.

The present invention may incorporate and be applied to multiplier circuits that use pairs of depletion mode transistors, or multiplier circuits where one transistor is a depletion mode device and the other is an enhancement mode device, as described in U.S. Pat. No. 4,906,873, with the restriction that $V_{tp}-V_{tn}>0$ and the circuit operation will be limited to $V_1 + V_2 <(V_{tp}-V_{tn})/2$.

The various voltage inputs to the circuits, $V_1$, $V_2$, $\lambda V_2$, $-V_2$, $V_{b1}$, and $V_{b2}$, as shown in FIG.'s 4, 5, and 6, may be provided by any suitable voltages supplies, which may for example, include voltage power supplies, the outputs of other multiplier circuits, or by any other type of electronic device or circuit which supplies a voltage output.

Obviously, many modifications and variations of the present invention are possible in light of the above teachings. It is therefore to be understood that within the scope of the appended claims, the invention may be practiced otherwise than as specifically described.

We claim:

1. A circuit, comprising:

a CMOS analog four-quadrant multiplier, including:

an n-channel field effect transistor having a gate, first and second terminals, a channel forming a source-drain path between said first and second terminals, a transconductance constant $\beta_n$, and a threshold voltage $V_{tn}$; and a p-channel field effect transistor having a gate, first and second terminals, a channel forming a source-drain path between said first and second terminals, a transconductance constant $\beta_p$, and a threshold voltage $V_{tp}$, wherein said second terminal of said n-channel transistor is operatively coupled to said first terminal of said p-channel transistor so as to form an output node;

means for providing a voltage $V_2$ to said first terminal of said n-channel transistor;

means for providing a voltage $-\lambda V_2$ to said second terminal of said p-channel transistor, where $\lambda$ is a variable voltage gain; and means for providing a voltage $(V_1+V_b)$ to said gates to said n− and p-channel transistors;

where an output current supplied from said output node into a ground is characterized by the equation:

$$I_o=\kappa\{(1+\lambda\xi)V_1V_2+\{(1-\xi\lambda\psi)V_T+(1+\lambda\xi)V_b\}V_2+(\lambda^2\xi-1)(V_2)^2/2\}$$

where:

$I_0$ is the output current; and $\kappa=\beta_n$.

$\xi=\beta_p/\beta_n$;

$\psi=-V_{tp}/V_{tn}$; and $V_T=-V_{tn}$.

2. The circuit of claim 1 wherein:

$\lambda$ is set to $\xi^{-\frac{1}{2}}$.

3. The circuit of claim 1 wherein:

$V_b$ is set to $-(1-\xi\lambda\psi)V_T/(1+\lambda\xi)$.

4. The circuit of claim 3 wherein:

$\lambda$ is set to $86^{-\frac{1}{2}}$.

5. A circuit comprising:

a first four-quadrant analog multiplier having a first output including a first quadratic error component;

a second four-quadrant analog multiplier having a second output including a second quadratic error component, said second output being operably coupled to said first output to form a common output; and means operably coupled to said first and second four-quadrant analog multipliers for eliminating quadratic error in said common output.

6. The circuit of claim 5, wherein:

said first four-quadrant analog multiplier is a first CMOS fourquadrant analog multiplier comprising;

an n-channel field effect transistor having a gate, first and second terminals, a channel forming a source-drain path between said first and second terminals, a threshold voltage $V_{tn}$, and transconductance constant $\beta_n$; and a channel field effect transistor having a gate, first and second terminals, a channel forming a source-drain path between said first and second terminals, a threshold voltage $V_{tp}$, and transconductance constant $\beta_p$; wherein said second terminal of said n-channel transistor is operatively coupled to said first terminal of said p-channel transistor so as to form a first output node; and said second four-quadrant analog multiplier is a second CMOS fourquadrant analog multiplier comprising:

an n-channel field effect transistor having a gate, first and second terminals, a channel forming a source-drain path between said first and second terminals, a threshold voltage substantially equal to $V_{tn}$; and transconductance constant substantially equal to $\beta_n$; and a p-channel field effect transistor having a gate, first and second terminals, a channel forming a source-drain path between said first and second terminals, a threshold voltage substantially equal to $V_{tp}$, and transconductance constant substantially equal to $\beta_p$, wherein said second terminal of said n-channel transistor is operatively coupled to said first terminal of said p-channel transistor to form a second output node, said first and second output nodes operably coupled together so as to form a common output.

7. A circuit comprising:

a first CMOs four-quadrant analog multiplier having a first output, comprising;

an n-channel field effect transistor having a gate, first and second terminals, a channel forming a source-drain path between said first and second terminals, a threshold voltage $V_{tn}$, and transconductance constant $\beta_n$; and a p-channel field effect transistor having a gate, first and second terminals, a channel forming a source-drain path between said first and second terminals, a threshold voltage $V_{tp}$; and transconductance constant $\beta_p$; wherein said second terminal of said n-channel transistor is operatively coupled to said first terminal of said p-channel transistor so as to form a first output node;

a second CMOS four-quadrant analog multiplier having a second output operably coupled to said first output to form a common output, comprising:

an n-channel field effect transistor having a gate, first and second terminals, a channel forming a source-drain path between said first and second terminals, a threshold voltage substantially equal to $V_{tn}$, and transconductance constant substantially equal to $\beta_n$; and a p-channel field effect transistor having a gate, first and second terminals, a channel forming a source-drain path between said first and second terminals, a threshold voltage substantially equal to $V_{tp}$, and transconductance constant substantially equal to $\beta_p$, wherein said second terminal of said n-channel transistor is operatively coupled to said first terminal of said p-channel transistor to form a second output node, said first and second output nodes operably coupled together so as to form a common output;

means for supplying a voltage $V_{b2}$ to said first terminal of said n-channel transistor of said first multiplier;

means for supplying a voltage $-V_{b2}$ to said first terminal of said n-channel transistor of said second multiplier;

means for supplying a voltage $V_{b2}$, to said second terminal of said p-channel transistor of said first multiplier;

means for supplying a voltage $-V_{b2}'$ to said second terminal of said p-channel transistor of said second multiplier; and means operably coupled to said first and second four-quadrant analog multipliers for eliminating quadratic error in said common output including means operably coupled to said first and second CMOS four-quadrant analog multipliers for adjusting a ratio, λ, where $\lambda = -V_{b2}'/V_{b2}'$ so that a quadratic dependence upon said voltages $V_{b2}$ and $V_{b2}'$ is eliminated at said common output.

8. The circuit of claim 7 wherein:

said quadratic error eliminating means includes:

a first unity gain inverting buffer having an input operably coupled to said first terminal of said n-channel transistor of said first CMOS four-quadrant analog multiplier and an output operably coupled to said first terminal of said n-channel transistor of said second CMOS four-quadrant analog multiplier; a second unity gain inverting buffer having an input operably coupled to said second terminal of said p-channel transistor of said first CMOS four-quadrant analog multiplier and an output operably coupled to said second terminal of said p-channel transistor of said second CMOS four-quadrant analog multiplier;

a high gain differential amplifier having a first input operably coupled to said common output, a second input operably coupled to a ground, and an output for providing a gain control voltage $V_G$; and an inverting voltage controlled amplifier having an input operably coupled to said first terminal of said n-channel transistor of said first CMOS four-quadrant analog multiplier, a variable voltage gain λ, an output operably coupled to said second terminal of said p-channel transistor of said first CMOS four-quadrant analog multiplier, and a gain control input operably coupled to receive said voltage, $V_G$, from said high gain differential amplifier;

means for providing a voltage V1 to said gates of said n- and p-channel transistors of said first and second CMOS four-quadrant analog multipliers;

said output of said inverting voltage controlled amplifier providing said voltage $V_{b2}'$ to said second terminal of said p-channel transistor of said first CMOS four-quadrant analog multiplier, where $V_{b2}' = -\lambda V_{b2}$;

said output of said first unity inverting buffer providing said voltage $-V_{b2}$ to said first terminal of said n-channel transistor of said second CMOS four-quadrant analog multiplier; and said output of said second unity inverting buffer providing said voltage $-V_{b2}'$ to said second terminal of said p-channel transistor of said second multiplier.

9. The circuit of claim 8 wherein:

the operation of said first CMOS four-quadrant multiplier is characterized by the equation:

$$I_{01} = \kappa[(1+\lambda\xi)V_{b1}V_{b2} + (1-\lambda\xi\psi)V_T V_{b2} + (\lambda^2\xi - 1)(V_{b2})^2/2]$$

where:

$I_{01}$ is the output current supplied by said first output node;

$\kappa = \beta_n$;

$\xi = \beta_p/\beta_n$;

ψis the ratio $-V_{tp}/V_{tn}$;

$V_T$ is equal to $-V_{tn}$; and the operation of said second CMOS four-quadrant multiplier is characterized by the equation:

$$I_{02} = \kappa[-(1+\lambda\nu)V_{b1}V_{b2} - (1-\xi\lambda\psi)V_T V_{b2} + (\lambda^2\xi - 1)(V_{b2})^2/2];$$

whereby, the sum of the outputs $I_{02}$ and $I_{02}$ is characterized by the equation:

$$I_{01} + I_{02} = 0 = \kappa(\lambda^2\xi - 1)(V_2)^2$$

so that said voltage $V_G$ is driven to a value which causes λ to assume the value of $\xi^{-\frac{1}{2}}$.

10. The circuit of claim 7 wherein:

said quadratic error eliminating means includes:

a first unity gain inverting buffer having an input operably coupled to said first terminal of said n-channel transistor of said first CMOS four-quadrant analog multiplier and an output operably coupled to said first terminal of said n-channel transistor of said second CMOS four-quadrant analog multiplier;

a second unity gain inverting buffer having an input operably coupled to said second terminal of said p-channel transistor of said first CMOS four-quadrant analog multiplier and an output operably coupled to said second terminal of said p-channel of said second CMOS four-quadrant analog multiplier;

a high gain differential amplifier having a first input operably coupled to said common output, a second input operably coupled to a ground, and an output for providing a gain control voltage $V_G$; and an inverting voltage controlled amplifier having an input operably coupled to said second terminal of said p-channel transistor of said first CMOS four-quadrant analog multiplier, a variable voltage gain 1/λ, an output operably coupled to said first terminal of said n-channel transistor of said first CMOS four-quadrant analog multiplier, and a gain control input operably coupled to receive said voltage, $V_G$, from said high gain differential amplifier;

means for providing a voltage $V_{b1}$ to said gates of said n- and p-channel transistors of said first and second CMOS four-quadrant analog multipliers;

said output of said inverting voltage controlled amplifier providing said voltage $V_{b2}$ to said first terminal of said n-channel transistor of said first CMOS four-quadrant analog multiplier, where $V_{b2}=-V_{b2}'/2$ said output of said first unity inverting buffer providing a voltage $-V_{b2}$ to said first terminal of said n-channel transistor of said second CMOS four-quadrant analog multiplier; and said output of said second unity inverting buffer providing a voltage $-V_{b2}'$ to said second terminal of said p-channel transistor of said second multiplier.

11. The circuit of claim 10 wherein:

the operation of said first CMOS four-quadrant multiplier is characterized by the equation:

$$I_{01}=\kappa[(1+\lambda\xi)V_{b1}V_{b2}+(1-\xi\lambda\psi)V_T V_{b2}+(\lambda^2\xi-1)\text{-}(V_{b2})^2/2\}$$

where:

$I_{01}$ is the output current supplied by said first output node;

$\kappa=\beta_n$;

$\xi=\beta_p/\beta_n$;

$\psi$ is the ratio $-V_{tp}/V_{tn}$;

$V_T$ is equal to $-V_{tn}$; and the operation of said second CMOS four-quadrant multiplier is characterized by the equation:

$$I_{02}-\kappa\{-(1+\lambda\xi)V_{b1}V_{b2}-(1-\xi\lambda\psi)V_T V_{b2}+(\lambda^2\xi\text{-}-1)(V_{b2})^2/2\};$$

whereby, the sum of the outputs $I_{02}$ and $I_{02}$ is characterized by the equation:

$$I_{01}+I_{02}=0=\kappa(\lambda^2\xi-1)(V_2)^2$$

so that said voltage $V_G$ is driven to a value which causes $\lambda$ to assume the value of $\xi^{-1/2}$

12. A circuit comprising:

a CMOS four-quadrant analog multiplier including an n-channel field effect transistor having a gate, first and second terminals, a channel forming a source-drain path between said first and second terminals, a threshold voltage $V_{tn}$, and transconductance constant $\beta_n$; and a p-channel field effect transistor having a gate, first and second terminals, a channel forming a source-drain path between said first and second terminals, a threshold voltage $V_{tp}$, and transconductance constant $\beta_p$; wherein said second terminal of said n-channel transistor is operatively coupled to said first terminal of said p-channel transistor so as to form an output node; and means operably coupled to said multiplier for eliminating offset error in an output from said output node of said multiplier.

13. A circuit comprising:

a four-quadrant CMOS analog multiplier, comprising:

an n-channel field effect transistor having a gate, first and second terminals, a channel forming a source-drain path between said first and second terminals, a threshold voltage $V_{tn}$, and transconductance constant $\beta_n$; and a p-channel field effect transistor having a gate, first and second terminals, a channel forming a source-drain path between said first and second terminals, a threshold voltage $V_{tp}$; and transconductance constant $\beta_p$; wherein said second terminal of said n-channel transistor is operatively coupled to said first terminal of said p-channel transistor so as to form an output node;

means operably coupled to said multiplier for eliminating offset error in said output of said multiplier including:

a high gain differential amplifier having a first input operably coupled to said output node, a second input operably coupled to a ground, and an output operably coupled to provide a voltage $V_B$ to said gate of said n- and p-channel transistors;

means for providing a voltage $v_{b2}$ to said first terminal of said n-channel transistor; and means for providing a voltage $-\lambda V_{b2}$ to said second terminal of said p-channel transistor, where $\lambda$ is a variable voltage gain.

14. The circuit of claim 13 wherein:

the output $I_0$ of said multiplier is characterized by the equation:

$$I_0=0=\kappa[(1+\lambda\xi)V_B V_{b2}+(1-\lambda\xi\psi)V_T V_{b2}]$$

so that $V_8$ is driven to the value $-(1-\lambda\xi\psi)V_T/(1+\lambda\xi)$;

where $I_0$ is the output current supplied at said output node;

$\kappa=\beta_n$ $\xi=\beta_p/\beta_n$ $V_T=-V_{tn}$;

$\lambda$ is a scaling factor; and $\psi$ is the ratio $-V_{tp}/V_{tn}$.

15. A circuit, comprising:

a quadratic error compensating circuit; and an offset error compensating circuit operably coupled to said quadratic error compensating circuit.

16. The circuit of claim 15 wherein:

said quadratic error compensating circuit includes:

a first CMOS four-quadrant analog multiplier, comprising:

an n-channel field effect transistor having a gate, first and second terminals, a channel forming a source-drain path between said first and second terminals, a threshold voltage $V_{tn}$, and transconductance constant $\beta_n$; and a p-channel field effect transistor having a gate, first and second terminals, a channel forming a source-drain path between said first and second terminals, a threshold voltage $V_{tp}$, and transconductance constant $\beta_p$; wherein said second terminal of said n-channel transistor is operatively coupled to said first terminal of said p-channel transistor so as to form a first output node; and a second CMOS four-quadrant analog multiplier comprising;

an n-channel field effect transistor having a gate, first and second terminals, a channel forming a source-drain path between said first and second terminals, a threshold voltage substantially equal to $V_{tn}$, and transconductance constant substantially equal to $\beta_n$; and a p-channel field effect transistor having a gate, first and second terminals, a channel forming a source-drain path between said first and second terminals, a threshold voltage substantially equal to $V_{tp}$, and transconductance constant substantially equal to $\beta_p$; wherein said second terminal of said n-channel transistor is operatively coupled to said first terminal of said p-channel transistor so as to form a second output node.

17. The circuit of claim 16 which further includes:

means for supplying a voltage $V_{b2}$ to said first terminal of said n-channel transistor of said first multiplier;

means for supplying a voltage $-V_{b2}$ to said first terminal of said n-channel transistor of said second multiplier;

means for supplying a voltage $V_{b2}'$ to said second terminal of said p-channel transistor of said first multiplier;

means for supplying a voltage $-V_{b2}'$ to said second terminal of said p-channel transistor of said second multiplier; and said quadratic error compensating circuit includes means operably coupled to said first and second CMOS four-quadrant analog multipliers for adjusting a ratio, λ, where $\lambda = -V_{b2}'/V_{b2}$, so that a quadratic dependence upon said voltages $V_{b2}$ and $V_{b2}'$ is eliminated at said common output.

18. The circuit of claim 17 wherein:

said quadratic error eliminating means includes:

a first unity gain inverting buffer having an input operably coupled to said first terminal of said n-channel transistor of said first CMOS four-quadrant analog multiplier and an output operably coupled to said first terminal of said n-channel transistor of said second CMOS four-quadrant analog multiplier;

a second unity gain inverting buffer having an input operably coupled to said second terminal of said p-channel transistor of said first CMOS four-quadrant analog multiplier and an output operably coupled to said second terminal of said p-channel of said second CMOS four-quadrant analog multiplier;

a high gain differential amplifier having a first input operably coupled to said common output, a second input operably coupled to a ground, and an output for providing a gain control voltage $V_G$; and an inverting voltage controlled amplifier having an input operably coupled to said first terminal of said n-channel transistor of said first CMOS four-quadrant analog multiplier, a variable voltage gain λ, an output operably coupled to said second terminal of said p-channel transistor of said first CMOS four-quadrant analog multiplier, and a gain control input operably coupled to receive said voltage, $V_G$, from said high gain differential amplifier;

means for providing a voltage $V_{b1}$ to said gates of said n- and pchannel transistors of said first and second CMOS four-quadrant analog multipliers; said output of said inverting voltage controlled amplifier providing said voltage $V_{b2}'$ to said second terminal of said p-channel transistor of said first CMOS four-quadrant analog multiplier, where $V_{b2}' = -\lambda V_{b2}$;

said output of said first unity inverting buffer providing said voltage $-V_{b2}$ to said first terminal of said n-channel transistor of said second CMOS four-quadrant analog multiplier; and said output of said second unity inverting buffer providing said voltage $-V_{b2}'$ to said second terminal of said p-channel transistor of said second multiplier.

19. The circuit of claim 18 wherein:

the operation of said first CMOS four-quadrant multiplier is characterized by the equation:

$$I_{01} = \kappa\{(1+\lambda\xi)V_{b1}V_{b2} + (1-\lambda\xi\psi)V_T V_{b2} + (\lambda^2\xi - 1-)V_{b2})^2/2\}$$

where

I·is the output current supplied by said first output node;

$\kappa = \beta_n$;

$\xi = \beta_p/\beta_n$;

ψis the ratio $-V_{tp}/V_{tn}$;

$V_T$ is equal to $-V_{tn}$; and the operation of said second CMOS four-quadrant multiplier is characterized by the equation:

$$I_{02} = \kappa\{-(1+\lambda\xi)V_{b1}V_{b2} - (1-\xi\lambda\psi)V_T V_{b2} + (\lambda^2\xi - -1)(V_{b2})^2/2\};$$

whereby, the sum of the outputs $I_{02}$ and $I_{02}$ is characterized by the equation;

$$I_{01} + I_{02} = 0 = \kappa(\lambda^2\xi - 1)(V_2)^2)$$

so that said voltage $V_G$ is driven to a value which causes λ to assume the value of $\xi^{-\frac{1}{2}}$.

20. The circuit of claim 15 wherein:

said offset compensation circuit further includes:

a third CMOS four-quadrant analog multiplier comprising;

an n-channel field effect transistor having a gate, first and second terminals, a channel forming a source-drain path between said first and second terminals, a threshold voltage $V_{tn}$; and transconductance constant $\beta_n$; and a p-channel field effect transistor having a gate, first and second terminals, a channel forming a source-drain path between said first and second terminals, a threshold voltage $V_{tp}$, and transconductance constant $\beta_p$; wherein said second terminal of said n-channel transistor is operatively coupled to said first terminal of said p-channel transistor so as to form an output node.

21. The circuit of claim 20 wherein:

said offset error eliminating means includes:

a high gain differential amplifier having an input operably coupled to said output node, and an output operably coupled to provide a voltage $V_B$ to said gates of said n- and p-channel transistors;

means for providing a voltage $V_{b2}$ to said first terminal of said nchannel transistor; and means for providing a voltage $-\lambda V_{b2}$ to said second terminal of said p-channel transistor.

22. The circuit of claim 21 wherein:

the output $I_0$ of said third CMOS four-quadrant analog multiplier is characterized by the equation:

$$I_0 = 0 = \kappa\{(1+\lambda\xi)V_B V_{b2} + (1-\lambda\xi\psi)V_T V_{b2}]$$

so that $V_B$ is driven to the value $-(1-\lambda\xi\psi)V_T/(1+\lambda\xi)$;

where:

$I_0$ is the output current supplied at said output node:

$\kappa = \beta_n$ $\xi = \beta_p/\beta_n$ $V_T = -V_{tn}$;

λis a scaling factor; and

ψis the ratio $-V_{tp}/V_{tn}$.

23. The circuit of claim 16 wherein:

said quadratic error eliminating means includes:

a first unity gain inverting buffer having an input operably coupled to said first terminal of said n-channel transistor of said first CMOS four-quadrant analog multiplier and an output operably coupled to said first terminal of said n-channel transistor of said second CMOS four-quadrant analog multiplier;

a second unity gain inverting buffer having an input operably coupled to said second terminal of said p-channel transistor of said first CMOS four-quadrant analog multiplier and an output operably coupled to said second terminal of said p-channel transistor of said second CMOS four-quadrant analog multiplier;

a high gain differential amplifier having a first input operably coupled to said common output, a second input operably coupled to a ground, and an output for providing a gain control voltage $V_G$; and an inverting voltage controlled amplifier having an input operably coupled to said second terminal of said p-channel transistor of said first CMOS four-quadrant analog multiplier, a variable voltage gain $1/\lambda$, an output operably coupled to said first terminal of said n-channel transistor of said first CMOS four-quadrant analog multiplier, and a gain control input operably coupled to receive said voltage, $V_G$, from said high gain differential amplifier;

means for providing a voltage $V_{b1}$ to said gates of said n- and p-channel transistors of said first and second CMOS four-quadrant analog multipliers;

said output of said inverting voltage controlled amplifier providing said voltage $V_{b2}$ to said first terminal of said n-channel transistor of said first CMOS four-quadrant analog multiplier, where $V_{b2} = -V_{b2}/\lambda$;

said output of said first unity inverting buffer providing a voltage $-V_{b2}$ to said first terminal of said n-channel transistor of said second CMOS four-quadrant analog multiplier; and said output of said second unity inverting buffer providing a voltage $-V_{b2}'$ to said second terminal of said p-channel transistor of said second multiplier.

24. The circuit of claim 23 wherein:

the operation of said first CMOS four-quadrant multiplier is characterized by the equation:

$$I_{01} = \kappa\{(1+\lambda\xi)V_{b1}V_{b2} + (1-\xi\lambda\psi)V_T V_{b2} + \lambda^2\xi - 1(-V_{b2})^2/2\}$$

where:

$I_{01}$ is the output current supplied by said first output node;

$\kappa = \beta_n$;

$\xi = \beta_p/\beta_n$;

$\psi$ is the ratio $-V_{tp}/V_{tn}$;

$V_T$ is equal to $-V_{tn}$; and the operation of said second CMOS four-quadrant multiplier is characterized by the equation:

$$I_{02} - \kappa\{-(1+\lambda\xi)V_{b1}V_{b2} - (1-\xi\lambda\psi)V_T V_{b2} + (\lambda^2\xi - 1)(V_{b2})^2/2\};$$

whereby, the sum of the outputs $I_{02}$ and $I_{02}$ is characterized by the equation:

$$I_{01} + I_{02} = 0 = \kappa(\lambda^2\xi - 1)(V_2)^2$$

so that said voltage $V_G$ is driven to a value which causes $\lambda$ to assume the value of $\xi^{-\frac{1}{2}}$.

* * * * *